US012585190B2

(12) United States Patent (10) Patent No.: US 12,585,190 B2
Son et al. (45) Date of Patent: Mar. 24, 2026

(54) LIQUID CHEMICAL SUPPLY APPARATUS AND LIQUID CHEMICAL SUPPLY SYSTEM

(71) Applicant: SEMES CO., LTD., Cheonan-si (KR)

(72) Inventors: Young Jun Son, Cheonan-si (KR); Woo Sin Jung, Cheonan-si (KR); Youngun Yun, Asan-si (KR); Jung Suk Goh, Hwaseong-si (KR)

(73) Assignee: SEMES CO., LTD., Cheonan-si (KR)

( * ) Notice: Subject to any disclaimer, the term of this patent is extended or adjusted under 35 U.S.C. 154(b) by 468 days.

(21) Appl. No.: 18/117,554

(22) Filed: Mar. 6, 2023

(65) Prior Publication Data

US 2023/0314951 A1 Oct. 5, 2023

(30) Foreign Application Priority Data

Apr. 1, 2022 (KR) ........................ 10-2022-0041060

(51) Int. Cl.
 *G03F 7/00* (2006.01)
 *G03F 7/039* (2006.01)
 *G03F 7/09* (2006.01)
 *G03F 7/16* (2006.01)
 *G03F 7/20* (2006.01)
 *G03F 7/30* (2006.01)

(52) U.S. Cl.
 CPC ..................................... *G03F 7/16* (2013.01)

(58) Field of Classification Search
 None
 See application file for complete search history.

(56) References Cited

U.S. PATENT DOCUMENTS

| 8,393,227 B2 | 3/2013 | Itoh et al. | |
| 9,348,340 B2 | 5/2016 | Nakashima et al. | |
| 2006/0137419 A1* | 6/2006 | Mizohata | G01F 1/48 |
| | | | 72/200 |
| 2018/0061641 A1 | 3/2018 | Choi et al. | |
| 2018/0065065 A1* | 3/2018 | Sasa | G03F 7/16 |
| 2020/0290101 A1 | 9/2020 | Osada et al. | |

FOREIGN PATENT DOCUMENTS

| JP | 10-172943 | 6/1998 |
| JP | 2006-184989 | 7/2006 |
| JP | 5361847 | 12/2013 |
| JP | 5893592 | 3/2016 |

(Continued)

OTHER PUBLICATIONS

Office Action from the Korean Intellectual Property Office dated Oct. 25, 2023.

*Primary Examiner* — Alexander M Weddle

(57) ABSTRACT

A liquid chemical supply apparatus for supplying a liquid chemical to a plurality of substrate processing apparatuses disposed at different heights includes a pump for providing a hydraulic pressure for moving the liquid chemical to the substrate processing apparatuses, a plurality of liquid chemical supply lines having ends connected to the pump and other ends separately connected to the substrate processing apparatuses, to provide passages through which the liquid chemical moves, and a pump vent line connected to the pump to discharge some of the liquid chemical to outside, wherein flow rate calibration lines are connected between the liquid chemical supply lines and the pump vent line.

20 Claims, 10 Drawing Sheets

(56) References Cited

FOREIGN PATENT DOCUMENTS

| | | |
|---|---|---|
| JP | 2018-137419 | 8/2018 |
| JP | 6887836 | 6/2021 |
| KR | 10-2007-0076085 | 7/2007 |
| KR | 10-2010-0044483 | 4/2010 |
| KR | 10-2018-0025448 | 3/2018 |

* cited by examiner

LIQUID CHEMICAL SUPPLY APPARATUS AND LIQUID CHEMICAL SUPPLY SYSTEM

CROSS-REFERENCE TO RELATED PATENT APPLICATION

This application claims the benefit of Korean Patent Application No. 10-2022-0041060, filed on Apr. 1, 2022, in the Korean Intellectual Property Office, the disclosure of which is incorporated herein in its entirety by reference.

BACKGROUND OF THE INVENTION

1. Field of the Invention

The present invention relates to a semiconductor apparatus and, more particularly, to a liquid chemical supply apparatus and liquid chemical supply system for performing a coating process.

2. Description of the Related Art

Various substrate processing apparatuses are used to perform various processes to manufacture semiconductor devices. Among these semiconductor processes, photolithography is a process of forming a certain photoresist pattern on a substrate. The photolithography process may mainly include coating, heat treatment, exposure, and development processes, and is performed using a plurality of apparatuses. The photolithography process determines a degree of integration of the semiconductor devices and thus is regarded as a criterion for determining semiconductor manufacturing capabilities.

Currently, to increase the integration and productivity of semiconductor devices, coating, heat treatment, and development processes are combined and automated in a single photo track apparatus. Furthermore, an exposure apparatus is disposed in line with the photo track apparatus and thus the above-mentioned processes may be successively performed to greatly increase productivity.

A multilayer photo track system in which processes such as coating and development in the photo track apparatus are divided into layers is being developed. When chambers for performing the coating process are provided in multiple layers, a process environment may change along a vertical direction. For example, when a liquid chemical is supplied from a lower portion of the system, a pressure applied from a pump may change due to a head difference caused by different heights of the chambers. As such, a technology for calibrating the process environment that changes based on the height is required.

SUMMARY OF THE INVENTION

The present invention provides a liquid chemical supply apparatus and liquid chemical supply system capable of supplying equal amounts of a liquid chemical to substrate processing apparatuses disposed at different heights.

The present invention also provides a liquid chemical supply apparatus and liquid chemical supply system capable of calibrating a flow rate of a very small amount of a liquid chemical.

However, the scope of the present invention is not limited thereto.

According to an aspect of the present invention, there is provided a liquid chemical supply apparatus for supplying a liquid chemical to a plurality of substrate processing apparatuses disposed at different heights, the liquid chemical supply apparatus including a pump for providing a hydraulic pressure for moving the liquid chemical to the substrate processing apparatuses, a plurality of liquid chemical supply lines having ends connected to the pump and other ends separately connected to the substrate processing apparatuses, to provide passages through which the liquid chemical moves, and a pump vent line connected to the pump to discharge some of the liquid chemical to outside, wherein flow rate calibration lines are connected between the liquid chemical supply lines and the pump vent line.

The other ends of the liquid chemical supply lines may be located at different heights.

The flow rate calibration lines may discharge, to the pump vent line, some of the liquid chemical supplied from the pump through the liquid chemical supply lines.

An amount of the liquid chemical discharged to the pump vent line through a first flow rate calibration line connected to a first liquid chemical supply line having another end located at a higher level may be greater than an amount of the liquid chemical discharged to the pump vent line through a second flow rate calibration line connected to a second liquid chemical supply line having another end located at a lower level.

A check valve for controlling a flow rate of the liquid chemical discharged to the pump vent line may be mounted on at least one of the flow rate calibration lines.

A liquid chemical passage of the check valve may have a width less than that of the liquid chemical passage of at least the flow rate calibration line.

A plurality of patterns may be provided on the liquid chemical passage of the check valve.

A porous portion may be disposed on the liquid chemical passage of the check valve.

The liquid chemical passage of the check valve may have an orifice shape.

The liquid chemical may be a liquid photoresist.

The liquid chemical supply apparatus may further include a controller for measuring flow rates of the liquid photoresist moving through the liquid chemical supply lines.

The flow rate calibration lines may discharge some of the liquid chemical supplied from the pump through the liquid chemical supply lines, to the pump vent line to calibrate a difference between amounts of the liquid photoresist supplied to the substrate processing apparatuses, to be within 10%.

The difference between the amounts of the liquid photoresist supplied to the substrate processing apparatuses may be less than or equal to 0.1 ml.

The liquid photoresist supplied from the other ends of the liquid chemical supply lines to the substrate processing apparatuses per unit process may be less than 1 ml (and greater than 0 ml).

On a basis of a flow rate of a liquid chemical supply line having another end located at a highest level, some of the liquid chemical may be discharged to the pump vent line through flow rate calibration lines connected to liquid chemical supply lines located under the liquid chemical supply line.

A feedback control valve and a flowmeter may be mounted on at least one of the flow rate calibration lines and the pump vent line.

The controller may control the feedback control valve to reduce a flow rate measured by the flowmeter, to be less than or equal to a set reference value, when the flow rate measured by the flowmeter is greater than the set reference value.

According to another aspect of the present invention, there is provided a liquid chemical supply system for supplying a liquid chemical to a plurality of substrate processing apparatuses disposed at different heights, the liquid chemical supply system including a liquid chemical supply apparatus and a liquid chemical storage apparatus, wherein the liquid chemical supply apparatus includes a pump for providing a hydraulic pressure for moving the liquid chemical from the liquid chemical storage apparatus to the substrate processing apparatuses, a plurality of liquid chemical supply lines having ends connected to the pump and other ends separately connected to the substrate processing apparatuses, to provide passages through which the liquid chemical moves, and a pump vent line connected to the pump to discharge some of the liquid chemical to outside, and wherein flow rate calibration lines are connected between the liquid chemical supply lines and the pump vent line.

The liquid chemical storage apparatus may include a liquid storage bottle for storing the liquid chemical, and a liquid trap tank interposed between the liquid storage bottle and the pump to hold the liquid chemical before supplying the liquid chemical to the pump, the pump may provide a hydraulic pressure for moving the liquid chemical from the liquid trap tank to the substrate processing apparatuses, and the pump vent line may be provided to discharge some of the liquid chemical of the liquid chemical storage apparatus.

According to another aspect of the present invention, there is provided a liquid chemical supply apparatus for supplying a liquid photoresist to a plurality of substrate processing apparatuses disposed at different heights, the liquid chemical supply apparatus including a pump for providing a hydraulic pressure for moving the liquid photoresist to the substrate processing apparatuses, a plurality of liquid chemical supply lines having ends connected to the pump and other ends separately connected to the substrate processing apparatuses, to provide passages through which the liquid photoresist moves, and a pump vent line connected to the pump to discharge some of the liquid photoresist to outside, wherein the other ends of the liquid chemical supply lines are located at different heights, wherein flow rate calibration lines are connected between the liquid chemical supply lines and the pump vent line, wherein a check valve for controlling a flow rate of the liquid photoresist discharged to the pump vent line is mounted on at least one of the flow rate calibration lines, and a liquid chemical passage of the check valve has a width less than that of the liquid chemical passage of at least the flow rate calibration line, and wherein the flow rate calibration lines discharge some of the liquid photoresist supplied from the pump through the liquid chemical supply lines, to the pump vent line to calibrate a difference between amounts of the liquid photoresist supplied to the substrate processing apparatuses, to be within 10%.

BRIEF DESCRIPTION OF THE DRAWINGS

The above and other features and advantages of the present invention will become more apparent by describing in detail embodiments thereof with reference to the attached drawings in which.

DETAILED DESCRIPTION OF THE INVENTION

Figure 1:
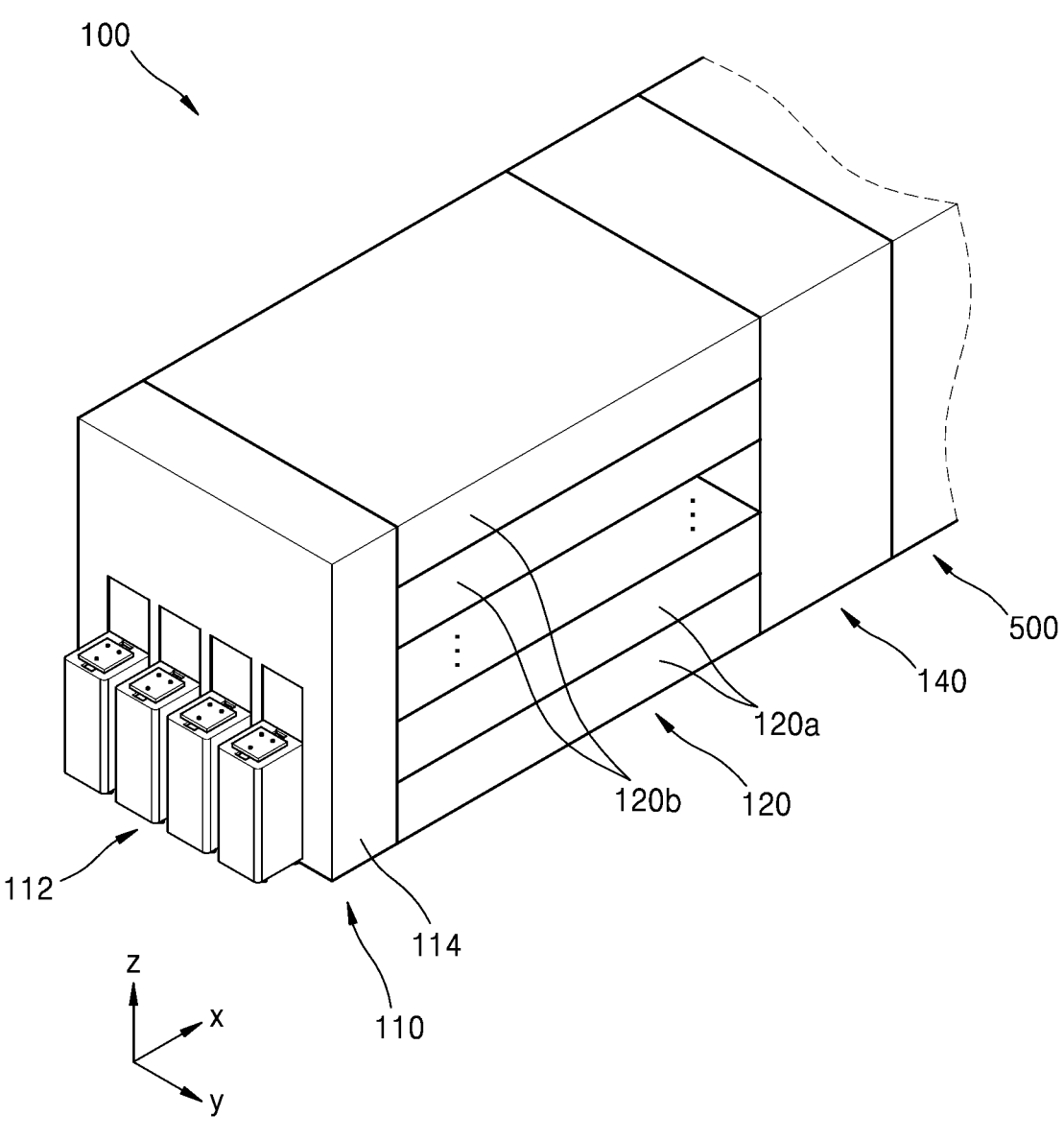
FIG. 1 is a perspective view of a substrate processing system, according to an embodiment of the present invention.

Hereinafter, the present invention will be described in detail by explaining embodiments of the invention with reference to the attached drawings.

The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the thicknesses or sizes of layers are exaggerated for clarity or convenience of explanation.

Embodiments of the invention are described herein with reference to schematic illustrations of idealized embodiments (and intermediate structures) of the invention. As such, variations from the shapes of the illustrations as a result, for example, of manufacturing techniques and/or tolerances, are to be expected. Thus, the embodiments of the invention should not be construed as limited to the particular shapes of regions illustrated herein, but are to include deviations in shapes that result, for example, from manufacturing.

Figure 2:
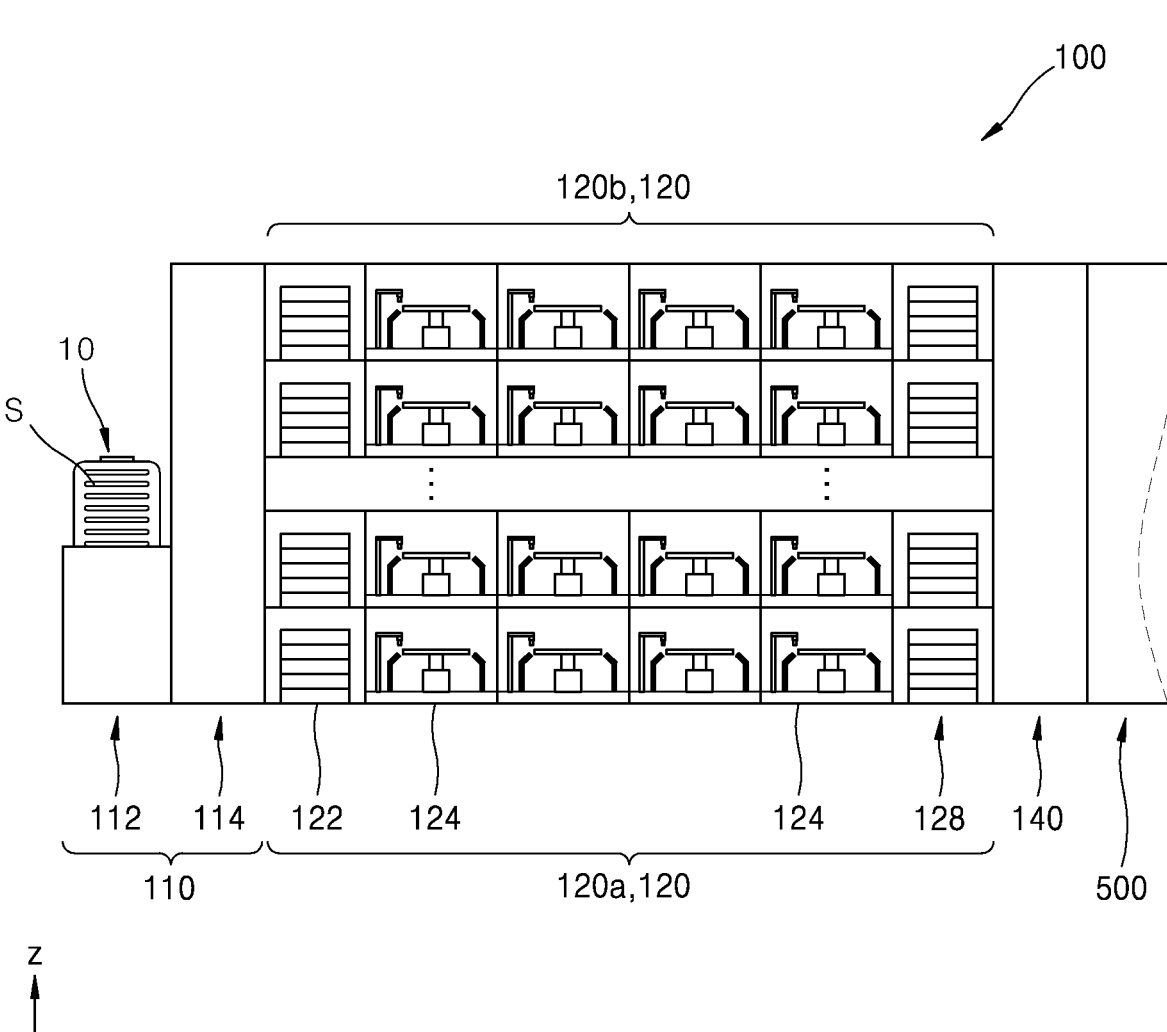
FIG. 2 is a cross-sectional view of the substrate processing system of FIG. 1.
Figure 3:
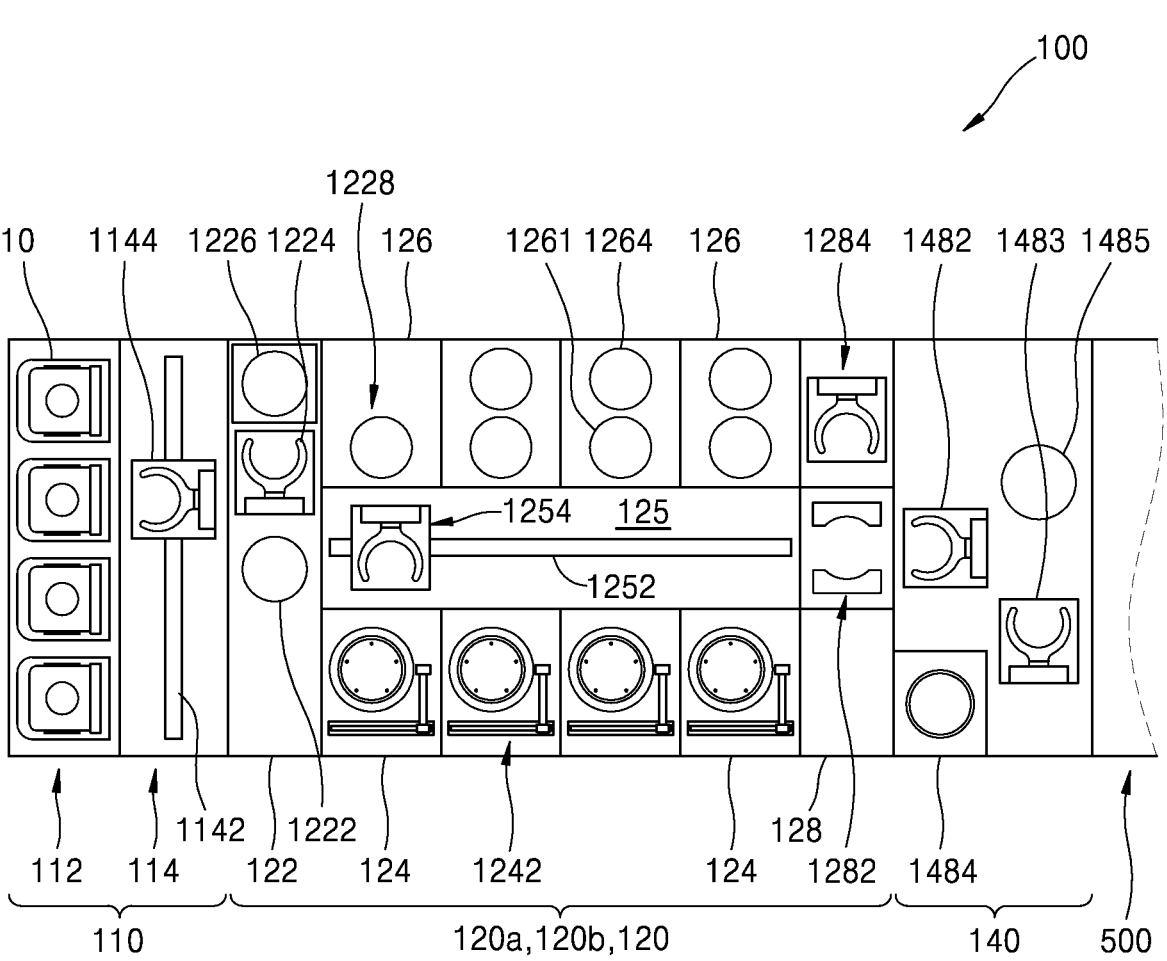
FIG. 3 is a plan view of the substrate processing system of FIG. 1.

FIG. 1 is a perspective view of a substrate processing system 100, according to an embodiment of the present invention, FIG. 2 is a cross-sectional view of the substrate processing system 100 of FIG. 1, and FIG. 3 is a plan view of the substrate processing system 100 of FIG. 1.

Referring to FIGS. 1 to 3, the substrate processing system 100 includes an index module 110, a processing module 120, and an interface module 140.

In an embodiment, the index module 110, the processing module 120, and the interface module 140 may be sequentially arranged in a row. For example, the index module 110, the processing module 120, and the interface module 140 may be arranged in a row in an x-axis direction, a width direction on a plane may be a y-axis direction, and a direction perpendicular to the plane may be a z-axis direction.

Specifically, the index module 110 may be provided to transfer substrates S from a carrier 10 holding the substrates S. For example, the substrates S in the index module 110 may be loaded from the carrier 10 and transferred to the processing module 120, and then returned to the carrier 10 after being processed.

The index module 110 may include a load port 112 and an index frame 114. The load port 112 may be located at a front end of the index module 110, and used as a port where the carrier 10 holding the substrates S is placed to load and/or unload the substrates S. The load port 112 may be selected appropriately and, for example, a plurality of load ports 112 may be arranged in the y-axis direction.

In an embodiment, the carrier 10 may use an enclosed type such as a front opening unified pod (FOUP). A plurality of substrates S, e.g., wafers, may be held by the carrier 10. The carrier 10 may be placed on the load port 112 by a user, a robot, or a transfer system (not shown) such as an overhead transfer, an overhead conveyor, or an automated guided vehicle in a factory.

An index robot 1144 may be disposed in the index frame 114. For example, the index robot 1144 may move on a guide rail 1142 mounted in the index frame 114. The index robot 1144 may be configured to move forward, backward, rotationally, upward, and/or downward.

The processing module 120 may be provided to perform coating and development processes on the substrate S. For example, the processing module 120 may include a coating block 120a where the coating process is performed on the substrate S, and a development block 120b where the development process is performed on the substrate S.

The coating block 120a may be provided as at least one layer and, in an embodiment, a plurality of coating blocks 120a may be provided as a plurality of layers stacked on one another. For example, the coating blocks 120a may have substantially the same structure to perform substantially the same process. The development block 120b may be provided as at least one layer and, in an embodiment, a plurality of development blocks 120b may be provided as a plurality of layers stacked on one another. For example, the development blocks 120b may have substantially the same structure to perform substantially the same process.

Furthermore, the coating blocks 120a and the development blocks 120b may be stacked on one another. For example, the development blocks 120b may be stacked on the coating blocks 120a. As another example, the coating blocks 120a may be stacked on the development blocks 120b, or the coating blocks 120a and the development blocks 120b may be alternately stacked on one another.

In an embodiment, each of the coating blocks 120a and the development blocks 120b may include a front buffer chamber 122, a liquid treatment chamber 124, a transfer chamber 125, a heat treatment chamber 126, and/or a rear buffer chamber 128. The heat treatment chamber 126 may be provided to perform a heat treatment process on the substrate S. The heat treatment process may include cooling and heating processes. The coating blocks 120a and the development blocks 120b may have substantially similar structures, or have different structures according to detailed functions thereof.

The liquid treatment chamber 124 in the coating block 120a may be provided to form a coating layer by supplying a liquid onto the substrate S. For example, the coating layer may include a photoresist layer or an anti-reflective layer. The liquid treatment chamber 124 in the development block 120b may be used to form a photoresist pattern by etching portions of the photoresist layer by supplying a developer onto the substrate S.

The transfer chamber 125 may be disposed between the heat treatment chamber 126 and the liquid treatment chamber 124 to transfer the substrate S between the heat treatment chamber 126 and the liquid treatment chamber 124 in the coating block 120a and the development block 120b. For example, a lengthwise direction of the transfer chamber 125 may be parallel with the x-axis direction.

A transfer robot 1254 may be disposed in the transfer chamber 125, so as to be movable on a guide rail 1252. The transfer robot 1254 may transfer the substrate S between the front buffer chamber 122, the liquid treatment chamber 124, the transfer chamber 125, the heat treatment chamber 126, and/or the rear buffer chamber 128. For example, the transfer robot 1254 may be configured to move forward, backward, rotationally, upward, and/or downward.

In an embodiment, a plurality of liquid treatment chambers 124 may be provided. The liquid treatment chambers 124 may be arranged in a lengthwise direction of the processing module 120, e.g., the x-axis direction. At least some of the liquid treatment chambers 124 may perform different liquid treatment processes. For example, a liquid treatment unit 1242 may be mounted in each of the liquid treatment chambers 124, and include a substrate supporter for supporting and rotating the substrate S, and a liquid sprayer capable of spraying a liquid onto the substrate S.

In an embodiment, a plurality of heat treatment chambers 126 may be provided. The heat treatment chambers 126 may be arranged in a lengthwise direction of the processing module 120, e.g., the x-axis direction. At least some of the heat treatment chambers 126 may perform different heat treatment processes. At least some of the heat treatment chambers 126 may include a cooling unit 1261 and a heating unit 1264 in a housing. Furthermore, a transfer plate (not shown) for transferring the substrate S between the cooling unit 1261 and the heating unit 1264 may be mounted in the some of the heat treatment chambers 126.

The front buffer chamber 122 may be provided in each of the coating blocks 120a and the development blocks 120b to accommodate the substrates S transferred from the index module 110. For example, a plurality of front buffer chambers 122 may be stacked on one another in the processing module 120. A cooler 1222 for accommodating or cooling the substrates S transferred from the index module 110 may be included in each front buffer chamber 122. Furthermore, a load robot 1224 for loading and/or unloading the substrates S may be disposed in the front buffer chamber 122.

A plurality of seating plates or cooling plates may be disposed in the cooler 1222. For example, the index robot 1144 of the index frame 114 may load the substrates S from the carrier 10 and place the substrates S in the cooler 1222. The cooler 1222 may not only cool the substrates S but also temporally store the substrates S, and thus also be called a buffer.

The rear buffer chamber 128 may temporally store the substrates S between the processing module 120 and the interface module 140. For example, a plurality of rear buffer chambers 128 may be stacked on one another in the processing module 120. A buffer 1282 where the substrates S are seated and a buffer robot 1284 for transferring the substrates S may be disposed in each rear buffer chamber 128.

The interface module 140 may connect the processing module 120 to an external exposure apparatus 500 to provide an interface for exchanging the substrates S between the processing module 120 and the exposure apparatus 500. For example, the interface module 140 may include an additional chamber 1484, an interface buffer 1485, and transfer robots 1482 and 1483.

In an embodiment, the additional chamber 1484 may perform a certain additional process before the substrate S processed in the coating block 120a is carried into the exposure apparatus 500, or perform a certain additional process before the substrate S processed in the exposure apparatus 500 is carried into the development block 120b.

For example, the additional process may include an edge exposure process for exposing an edge region of the substrate S, a top surface cleaning process for cleaning a top surface of the substrate S, or a bottom surface cleaning process for cleaning a bottom surface of the substrate S. Furthermore, a fan filter unit (not shown) for forming downward airflows may be added at the top of the interface module 140.

In the following description, the liquid treatment chambers 124 will be described as an example of substrate processing apparatuses 200: 210, 220, and 230 (see FIG. 4 and FIG. 5) for processing the substrates S. For example, a photoresist coating process may be performed on the substrates S in the substrate processing apparatuses 200.

Figure 4:
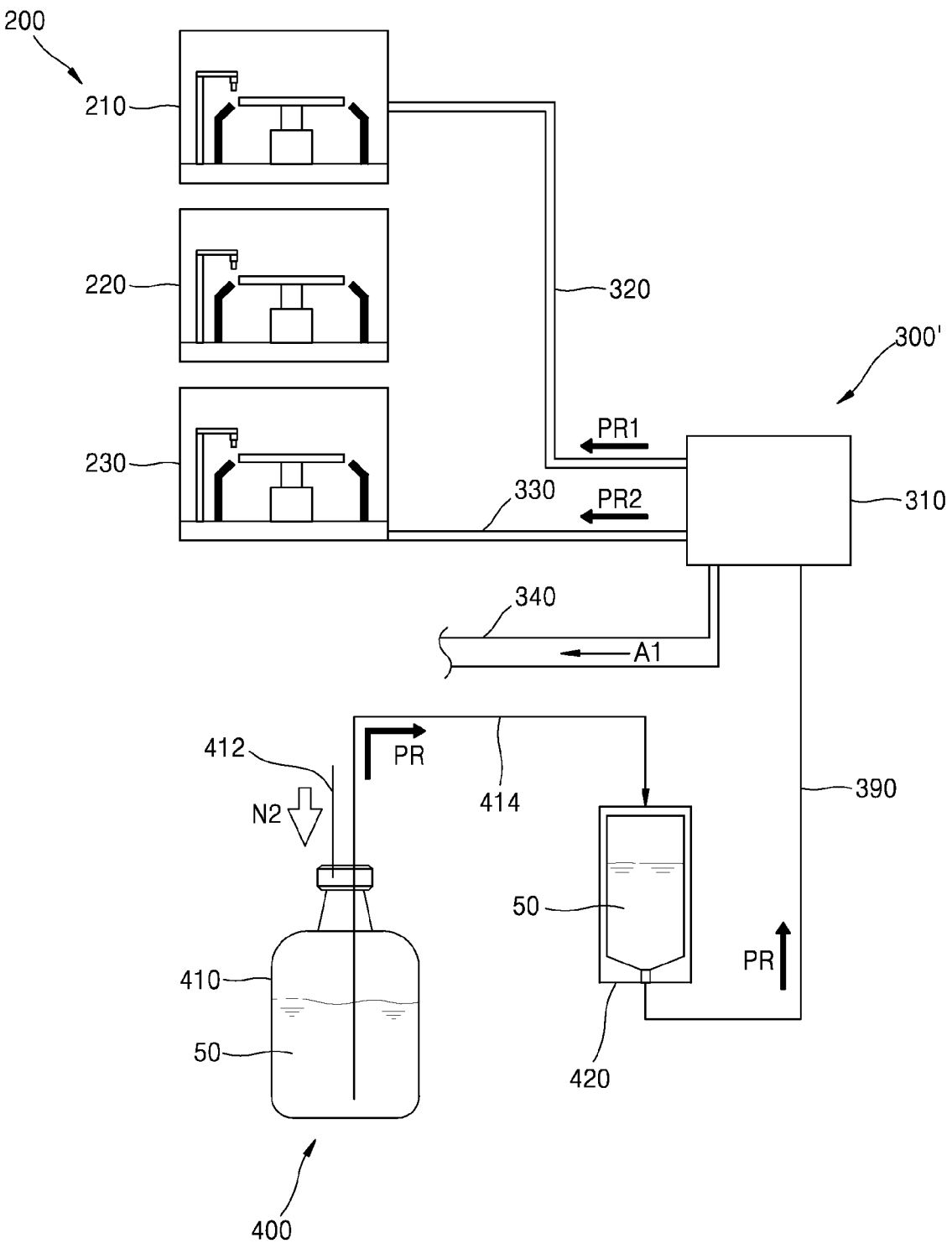
FIG. 4 is a schematic view of a liquid chemical supply apparatus and liquid chemical supply system according to a comparative example.
Figure 5:
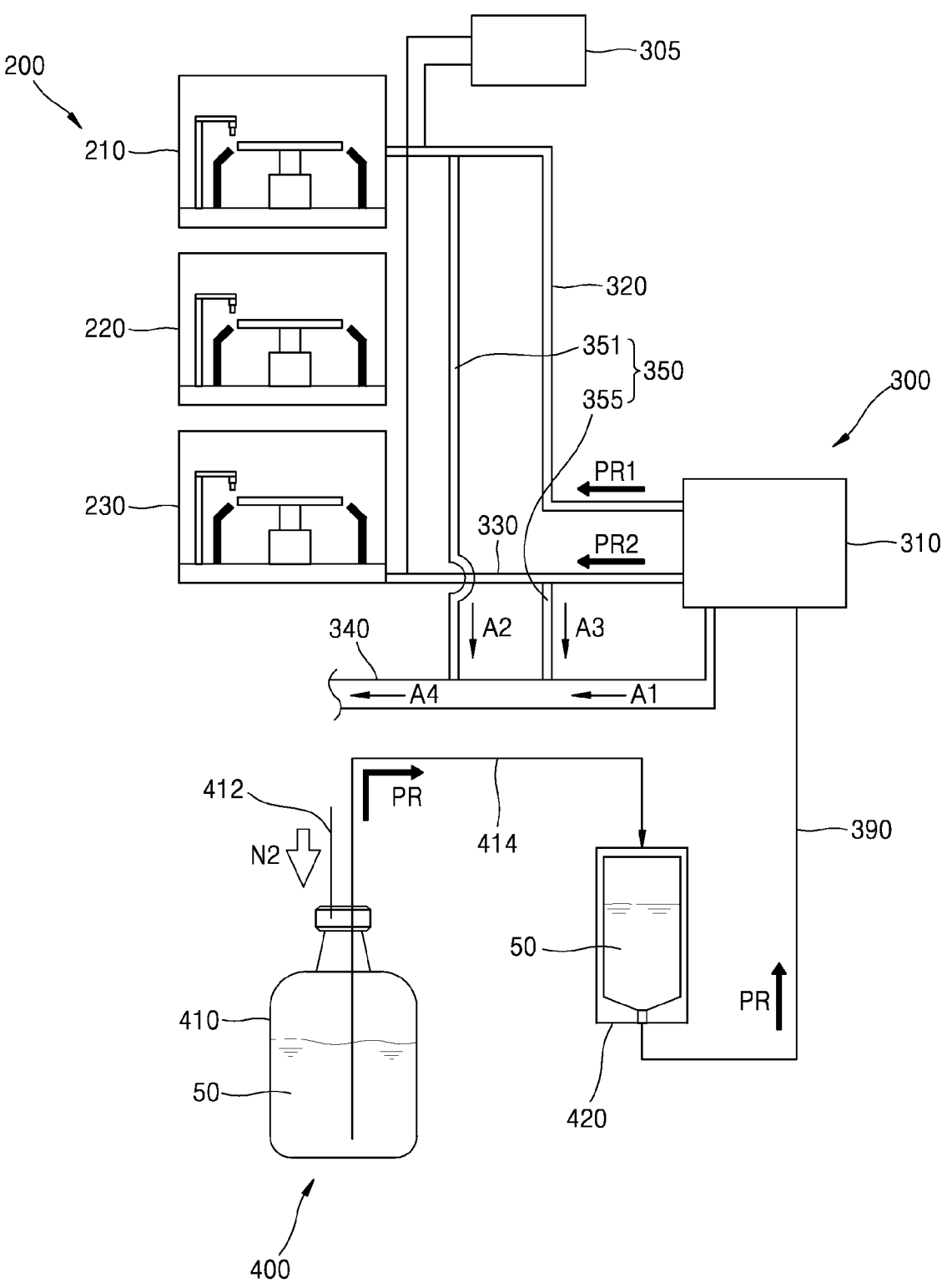
FIG. 5 is a schematic view of a liquid chemical supply apparatus and liquid chemical supply system according to an embodiment of the present invention.

FIG. 4 is a schematic view of a liquid chemical supply apparatus 300' and a liquid chemical supply system according to a comparative example. FIG. 5 is a schematic view of a liquid chemical supply apparatus 300 and a liquid chemical supply system according to an embodiment of the present invention. In FIGS. 4 and 5, like elements are denoted by like reference numerals.

Initially, referring to FIG. 4, the liquid chemical supply system of the comparative example includes the liquid chemical supply apparatus 300' and a liquid chemical storage apparatus 400.

The liquid chemical supply apparatus 300' includes a pump 310, a plurality of liquid chemical supply lines 320 and 330, and a pump vent line 340.

The pump 310 may be provided to pump a liquid chemical PR (or a liquid 50) from the liquid chemical storage apparatus 400 to the substrate processing apparatuses 200: 210, 220, and 230. The pump 310 may provide a hydraulic pressure for moving the liquid chemical PR from the liquid chemical storage apparatus 400 to the substrate processing apparatuses 200. For example, the pump 310 may receive the liquid chemical PR (or the liquid 50) through a liquid chemical delivery line 390 of the liquid chemical storage apparatus 400, and deliver the liquid chemical PR to the plurality of liquid chemical supply lines 320 and 330. The liquid chemical supply lines 320 and 330 may be respectively connected to the substrate processing apparatuses 210 and 230 to supply the liquid chemical PR to the substrate processing apparatuses 200.

A plurality of substrate processing apparatuses 200: 210, 220, and 230 may be disposed along a vertical direction. From another point of view, a plurality of substrate processing apparatuses 200: 210, 220, and 230 may be disposed at different heights. For example, the substrate processing apparatuses 210 and 230 may be supplied with the same liquid chemical PR, and the substrate processing apparatus 220 may be supplied with a different liquid chemical. Therefore, it is assumed herein that the liquid chemical supply lines 320 and 330 are respectively connected to the substrate processing apparatuses 210 and 230 except for the substrate processing apparatus 220.

The liquid chemical supply lines 320 and 330 may have ends connected to the pump 310, and other ends separately connected to the substrate processing apparatuses 210 and 230. Because one pump 310 is provided, the ends of the liquid chemical supply lines 320 and 330 are located at the same height. Because the substrate processing apparatuses 210 and 230 are disposed at different heights, the other ends of the liquid chemical supply lines 320 and 330 respectively connected to the substrate processing apparatuses 210 and 230 are located at different heights.

An end of the pump vent line 340 may be connected to the pump 310, and another end thereof may extend to the outside. The pump vent line 340 is provided to discharge (A1) air or the liquid chemical PR (or the liquid 50). For example, the pump vent line 340 may be connected to the liquid chemical storage apparatus 400. When a liquid storage bottle 410 is replaced after the liquid 50 (or the liquid chemical PR) is used up, or when the liquid 50 (or the liquid chemical PR) in a liquid trap tank 420 has bubbles, a certain amount of the liquid 50 may be discharged first through the pump vent line 340. Then, the liquid 50 (or the liquid chemical PR) may be moved from the pump 310 to the liquid chemical supply lines 320 and 330.

The liquid chemical storage apparatus 400 includes the liquid storage bottle 410 and the liquid trap tank 420. The liquid trap tank 420 delivers the liquid chemical PR through the liquid chemical delivery line 390 to the liquid chemical supply apparatus 300'.

The liquid storage bottle 410 may store the liquid 50 (or the liquid chemical PR), and be replaced by a new bottle after use. Optionally, a gas injection line 412 may be connected to the liquid storage bottle 410 to press and discharge the liquid 50.

The pump 310 may be provided to pump the liquid 50 (or the liquid chemical PR) from the liquid storage bottle 410 to the substrate processing apparatuses 200: 210, 220, and 230. For example, an outlet of the liquid trap tank 420 may be connected to the pump 310 for pumping the liquid 50 to the substrate processing apparatuses 200, and an inlet of the liquid trap tank 420 may be connected to the liquid storage bottle 410 storing the liquid 50.

The liquid trap tank 420 may be interposed between the liquid storage bottle 410 and the pump 310 to hold the liquid 50 (or the liquid chemical PR) supplied from the liquid storage bottle 410 before supplying the liquid 50 to the pump 310. For example, the liquid trap tank 420 may inhibit or eliminate bubbles when the liquid 50 is initially supplied from the liquid storage bottle 410 or when the liquid storage bottle 410 is replaced after the liquid 50 is used up. As such, the liquid 50 in the liquid storage bottle 410 may be used to the bottom to minimize the amount of residue.

When the pump 310 operates, suction power may be provided through the liquid trap tank 420 to the liquid storage bottle 410. As such, when the liquid 50 is pumped from the liquid trap tank 420 and delivered to the substrate processing apparatuses 200, the liquid 50 may be naturally provided from the liquid storage bottle 410 through a connection line 414 to the liquid trap tank 420 by an amount by which the liquid 50 is discharged and a liquid level of the liquid trap tank 420 is reduced.

In an embodiment, when the liquid level in the liquid trap tank 420 is reduced to weaken the suction power, an inert gas, e.g., a nitrogen gas, may be injected through the gas injection line 412 into the liquid storage bottle 410 to supply the liquid 50 from the liquid storage bottle 410 to the liquid trap tank 420.

Referring back to FIG. 4, the ends of the liquid chemical supply lines 320 and 330 are connected to the pump 310 and thus are located at the same height. On the other hand, the other ends of the liquid chemical supply lines 320 and 330 are connected to the substrate processing apparatuses 210 and 230 disposed at different heights, and thus the heights thereof may also be different. That is, because the substrate processing apparatuses 210 and 230 are disposed at different heights, the pressure applied by the pump 310 may change due to a head difference. As such, an amount of a liquid chemical PR1 supplied through the first liquid chemical supply line 320 connected to the first substrate processing apparatus 210 located at a higher level differs from an amount of a liquid chemical PR2 supplied through the second liquid chemical supply line 330 connected to the second substrate processing apparatus 230 located at a lower level.

For example, an amount of a supplied liquid photoresist in an ArF-I system is about several ml (milliliter) and, more specifically, less than 1 ml, and even a small difference between the amounts of the liquid chemicals PR1 and PR2 supplied through the first and second liquid chemical supply lines 320 and 330 may cause problems. Due to a difference between flow rates of the liquid chemicals PR1 and PR2 supplied to the first and second substrate processing apparatuses 210 and 230, a photoresist may be coated on the substrates S with different thicknesses or aggregate on portions of the substrates S.

Therefore, in the liquid supply system including the liquid chemical supply apparatus 300 and the liquid chemical storage apparatus 400 of the present invention, a difference in flow rate due to a head difference between the substrate processing apparatuses 210 and 230 disposed at different heights is calibrated. The following description related to FIG. 5 will be focused on only the difference from the configuration of FIG. 4, and the same configuration will not be repeatedly described.

Referring to FIG. 5, the liquid chemical supply system according to an embodiment of the present invention includes the liquid chemical supply apparatus 300 and the liquid chemical storage apparatus 400.

The liquid chemical supply apparatus 300 includes the pump 310, the plurality of liquid chemical supply lines 320 and 330, and the pump vent line 340. Flow rate calibration lines 350: 351 and 355 may be connected between the liquid chemical supply lines 320 and 330 and the pump vent line 340.

Because the other ends of the liquid chemical supply lines 320 and 330 are located at different heights and the pump vent line 340 extends from the pump 310, the flow rate calibration lines 350: 351 and 355 for connecting the liquid chemical supply lines 320 and 330 to the pump vent line 340 may extend in a vertical direction overall. However, as long as the purpose of connecting the liquid chemical supply lines 320 and 330 at different heights to the pump vent line 340 is achieved, the flow rate calibration lines 350: 351 and 355 are not limited to extending in a vertical direction.

For example, the first flow rate calibration line 351 is connected between the pump vent line 340 and the first liquid chemical supply line 320 connected to the first substrate processing apparatus 210 located at a higher level, and the second flow rate calibration line 355 is connected between the pump vent line 340 and the second liquid chemical supply line 330 connected to the second substrate processing apparatus 230 located at a lower level.

The flow rate calibration lines 350: 351 and 355 may provide passages for discharging, to the pump vent line 340, some of the liquid chemicals PR1 and PR2 supplied from the pump 310 through the liquid chemical supply lines 320 and 330. Different flow rates of the liquid chemicals PR1 and PR2 may be calibrated to be substantially the same by discharging some of the liquid chemicals PR1 and PR2 to the pump vent line 340. For example, because an applied pressure changes due to a head difference, the amount of the liquid chemical PR1 moving through the first liquid chemical supply line 320 connected to the first substrate processing apparatus 210 located at a higher level may be less than the amount of the liquid chemical PR2 moving through the second liquid chemical supply line 330 connected to the second substrate processing apparatus 230 located at a lower level. In this case, the amounts of the liquid chemicals PR1 and PR2 may be calibrated to be substantially the same by discharging (A3) some of the liquid chemical PR2 through the second flow rate calibration line 355 to the pump vent line 340. As another example, the amounts of the liquid chemicals PR1 and PR2 may be calibrated to be substantially the same by increasing the amount of the liquid chemical discharged (A2) through the first flow rate calibration line 351 to the pump vent line 340 compared to the amount of the liquid chemical discharged (A3) through the second flow rate calibration line 355 to the pump vent line 340.

At least one of the liquid chemical discharged (A1) through the pump vent line 340 from the liquid chemical storage apparatus 400 and the liquid chemicals discharged (A2 and A3) through the first and second flow rate calibration lines 351 and 355 may be discharged (A4) to an external collection apparatus (not shown). The collection apparatus may be provided as a liquid chemical reuse system.

Meanwhile, a controller 305 may be connected to the liquid chemical supply lines 320 and 330. The controller 305 may measure the flow rates of the liquid chemicals PR1 and PR2 moving through the liquid chemical supply lines 320 and 330, and control the amounts of the liquid chemicals discharged (A2 and A3) through the flow rate calibration lines 350. The controller 305 may include flowmeters and be provided to receive, from the flowmeters, signals related to the flow rates.

According to an embodiment, in an ArF-I system, the liquid chemical supply apparatus 300 is provided to supply a liquid photoresist. The amounts of the liquid photoresists PR1 and PR2 supplied to the substrate processing apparatuses 200 per unit process may be less than 1 ml (and greater than 0 ml). A difference between the flow rates of the liquid photoresists PR1 and PR2 due to a head difference caused by the different heights of the substrate processing apparatuses 210 and 230 may be within 0.1 ml. The controller 305 may calibrate (i.e., control) a difference between the amounts of the liquid photoresists PR1 and PR2 supplied to the substrate processing apparatuses 210 and 230, to be within 10% by measuring the flow rates of the liquid chemicals PR1 and PR2 moving through the liquid chemical supply lines 320 and 330, and controlling the amounts of the liquid chemicals discharged (A2 and A3) through the flow rate calibration lines 350 to the pump vent line 340.

According to an embodiment, on the basis of the flow rate of the liquid chemical supply line 320 having the other end located at the highest level, the controller 305 may discharge (A3) some of the liquid chemical PR2 to the pump vent line 340 through the flow rate calibration line 355 connected to the liquid chemical supply line 330 located under the liquid chemical supply line 320. That is, the liquid chemical PR1 of the liquid chemical supply line 320 located at the highest level may be normally supplied to the substrate processing apparatus 210, and some of the liquid chemical PR2 of the liquid chemical supply lines 330 located under the liquid chemical supply line 320 may be discharged (A3), thereby calibrating the difference between the amounts of the liquid chemicals PR1 and PR2.

Figure 6:
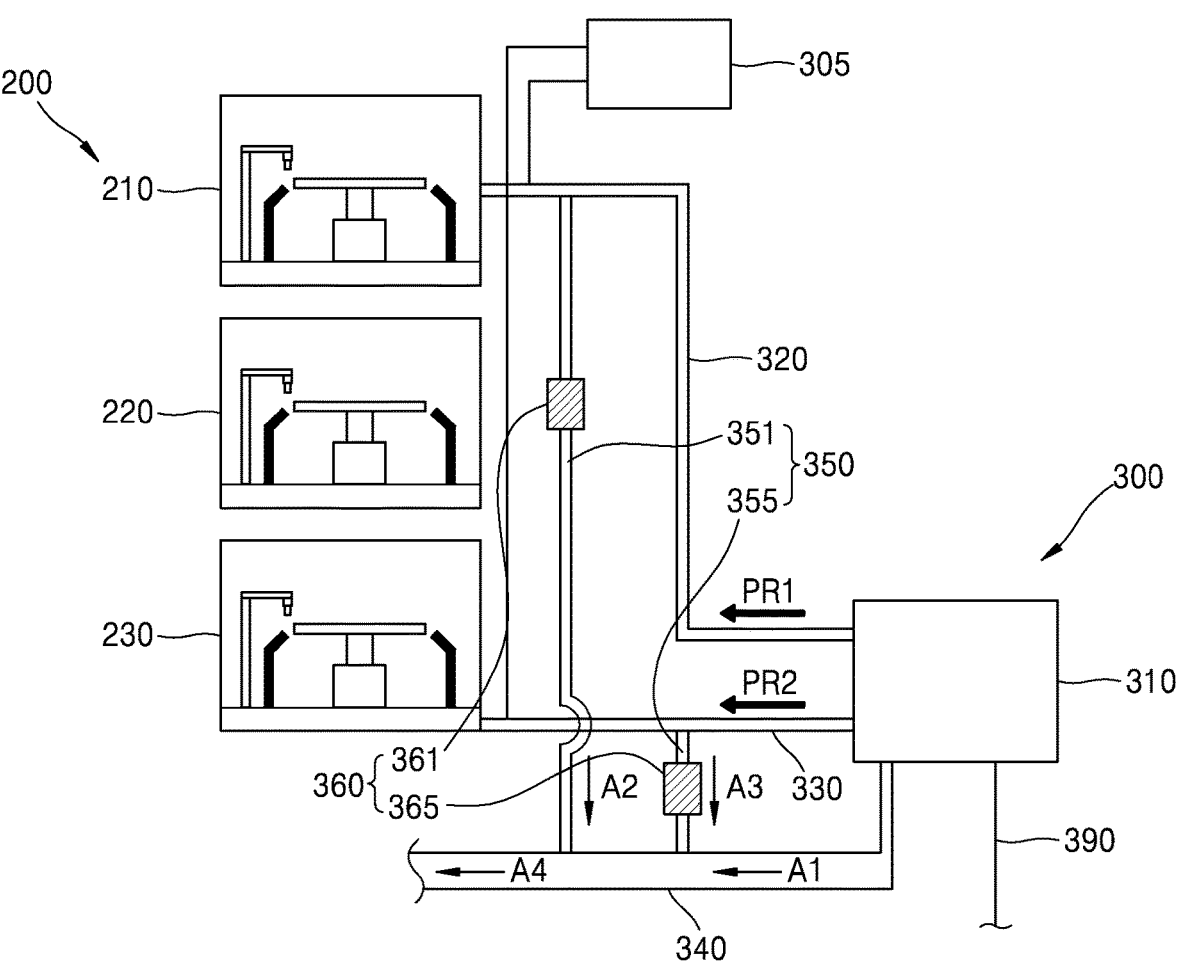
FIG. 6 is a schematic view of a liquid chemical supply apparatus according to another embodiment of the present invention.

FIG. 6 is a schematic view of the liquid chemical supply apparatus 300 according to another embodiment of the present invention.

Referring to FIG. 6, in the liquid chemical supply apparatus 300, check valves 360: 361 and 365 may be mounted on the flow rate calibration lines 350: 351 and 355. The check valves 360: 361 and 365 may be mounted on one or both of the flow rate calibration lines 350: 351 and 355. The check valves 360 may be provided to precisely control the flow rates of the liquid chemicals A2 and A3 discharged to the pump vent line 340.

As described above, the amounts of the liquid chemicals PR1 and PR2 supplied through the liquid chemical supply lines 320 and 330 per unit process may be 1 ml, and a difference between the flow rates of the liquid photoresists PR1 and PR2 due to a head difference may be within 0.1 ml. Because the flow rates of the liquid photoresists PR1 and PR2 are very small, in order to calibrate the small flow rates, the flow rate calibration lines 350: 351 and 355 need to have very small diameters and allow only flow rates less than 1 ml. In this regard, the liquid chemical supply apparatus 300 of the present invention may mount the check valves 360 on the flow rate calibration lines 350 to finely control the flow rates.

The check valves 360 may have a shape providing resistance to the liquid chemicals A2 and A3 moving through the flow rate calibration lines 350 to the pump vent line 340. For example, liquid chemical passages of the check valves 360 may have widths less than those of the liquid chemical passages of the flow rate calibration lines 350. Herein, when the liquid chemical passages of the check valves 360 have the less widths, it may mean that widths of passages of the check valves 360 on the basis of cross-sections perpendicular to directions in which the liquid chemicals move are less than the widths of the passages of the flow rate calibration lines 350. Alternatively, it may mean that a sum of cross-sectional areas of the passages of the check valves 360 on the basis of the cross-sections perpendicular to the direction in which the liquid chemicals move is less than the sum of cross-sectional areas of the passages of the flow rate calibration lines 350.

Figure 7:
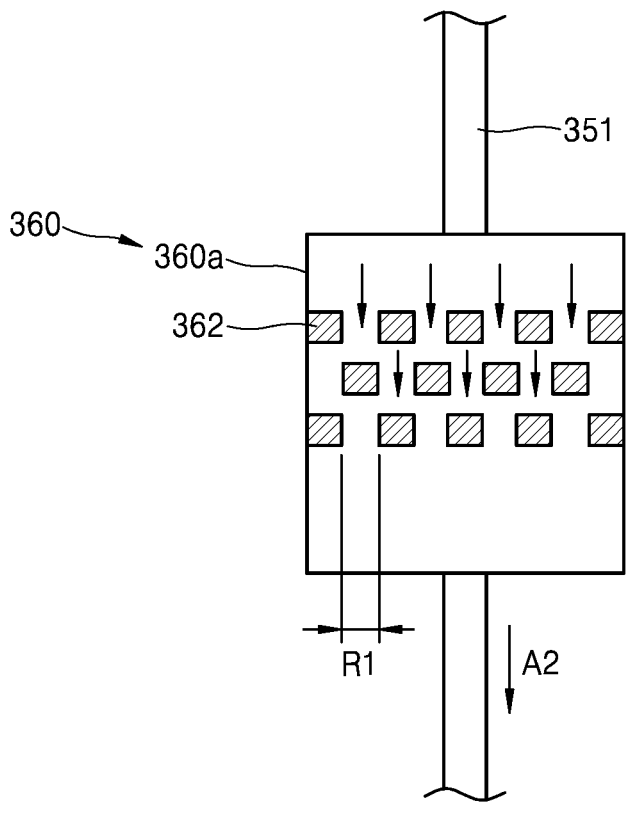
FIGS. 7 to 9 are side cross-sectional views of check valves according to embodiments of the present invention.
Figure 8:
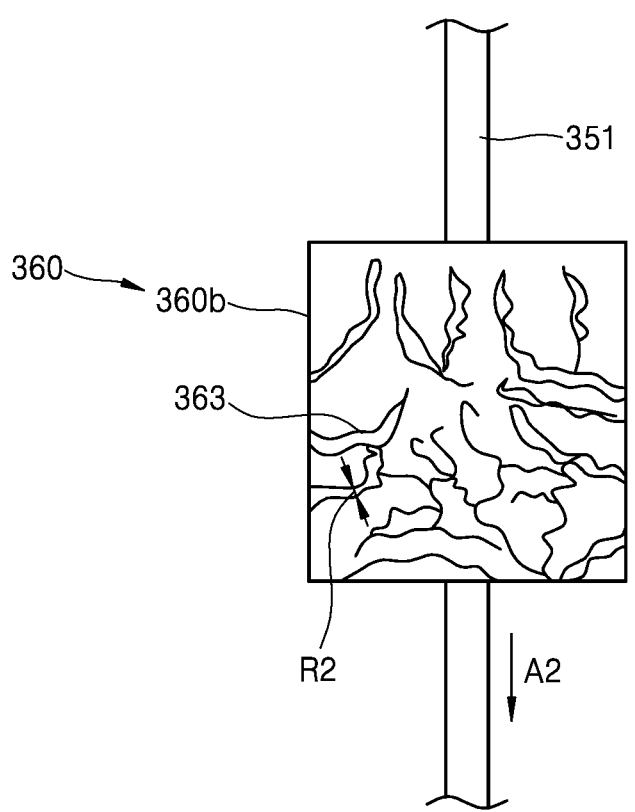
Figure 9:
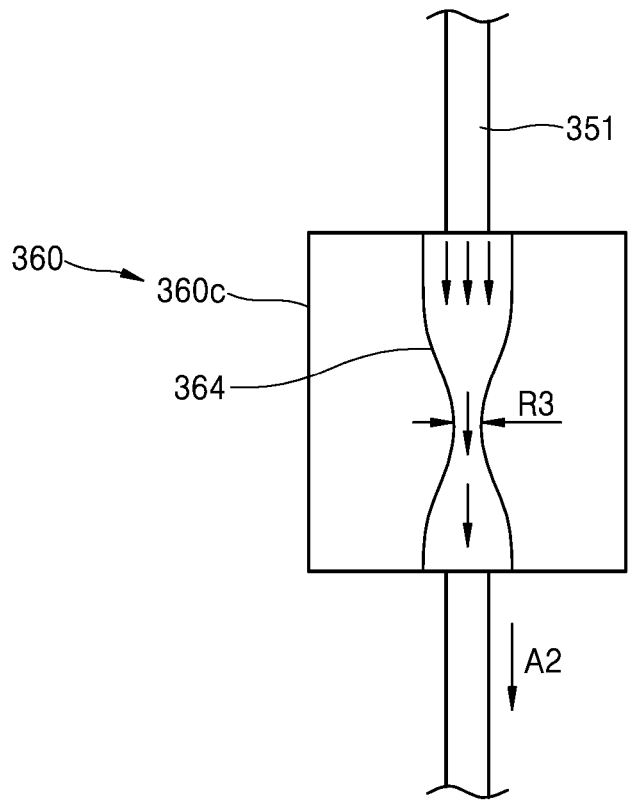

FIGS. 7 to 9 are side cross-sectional views of check valves 360a to 360c according to embodiments of the present invention.

Referring to FIG. 7, a plurality of patterns 362 may be provided on a liquid chemical passage of the check valve 360a. A liquid chemical moving along the flow rate calibration line 351 may move along holes between the patterns 362 of the check valve 360a (see arrow directions). A diameter or width R1 of the holes between the patterns 362 is less than the width of the liquid chemical passage of the flow rate calibration line 351. Therefore, the liquid chemical moving along the flow rate calibration line 351 may receive resistance by the patterns 362 of the check valve 360a, and the amount of the liquid chemical discharged (A2) to the pump vent line 340 may be finely controlled. For example, the diameter R1 of the holes may be several micrometers to hundreds of micrometers. The holes formed by the patterns 362 may have a regular pattern shape of spots, lines, slits, or the like, or an irregular pattern shape.

Referring to FIG. 8, a porous portion 363 may be disposed on a liquid chemical passage of the check valve 360b. The porous portion 363 may be a structure including microchannels or gaps through which a liquid chemical may move. For example, the porous portion 363 may be made of a porous material such as a filter or a sponge and a diameter R2 of passages through which the liquid chemical may move may be several micrometers to hundreds of micrometers. As another example, the porous portion 363 may be made of a material through which the liquid chemical may move due to the capillary action. As another example, the porous portion 363 may be made of a material having a polycrystalline or amorphous structure such that the liquid chemical may move through gaps between crystal grains.

Referring to FIG. 9, a liquid chemical passage of the check valve 360c may include an orifice shape 364. From another point of view, the check valve 360c may include a shape having a width R3 rapidly reduced from the width of the liquid chemical passage of the flow rate calibration line 351. For example, the width R3 may be less than 1 mm.

Meanwhile, in addition to the embodiments of FIGS. 7 to 9, any structure in which the liquid chemical passage of the check valve 360 has a width less than that of the liquid chemical passage of the flow rate calibration line 350 may be employed without limitation.

Figure 10:
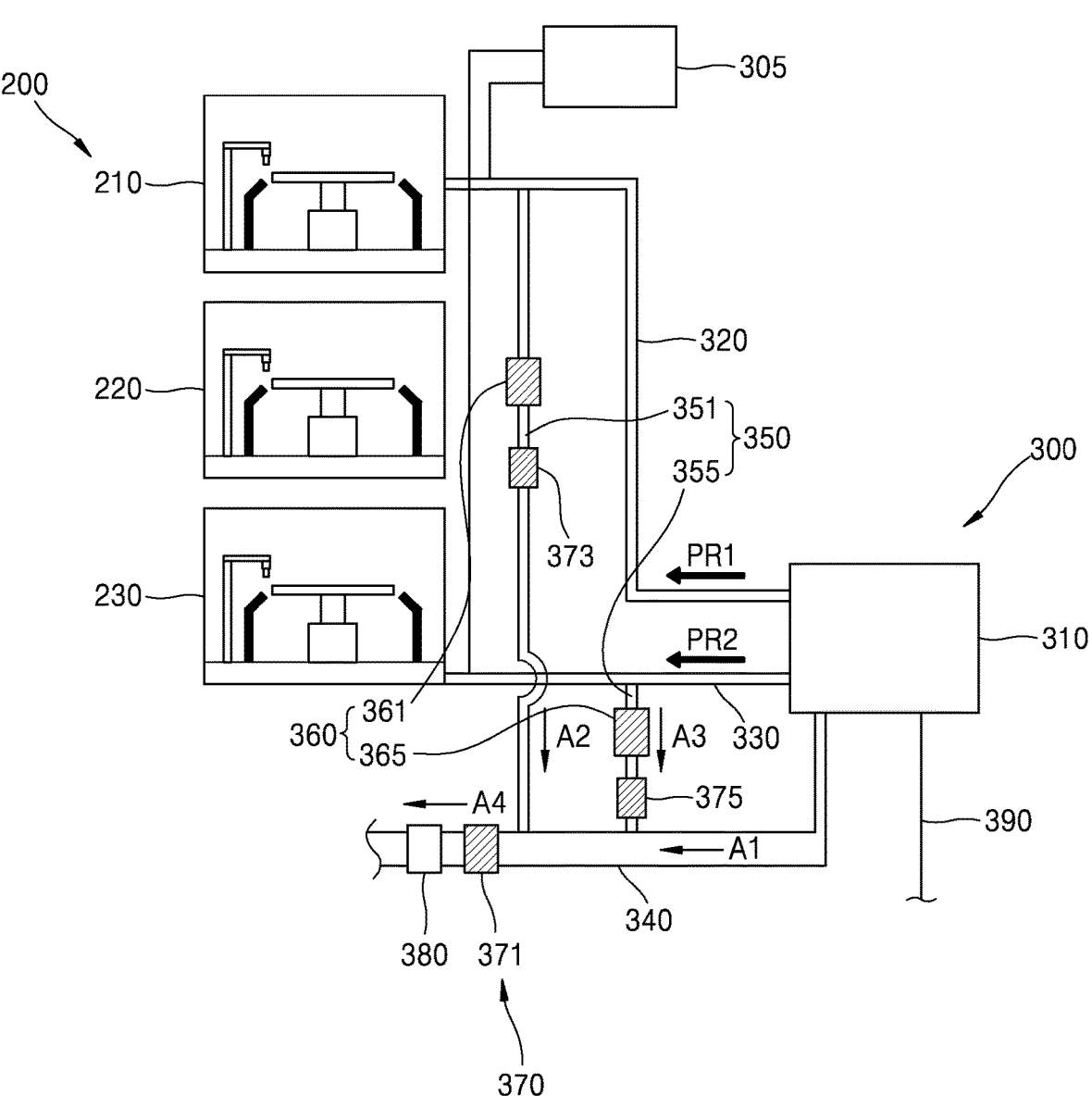
FIG. 10 is a schematic view of a liquid chemical supply apparatus according to another embodiment of the present invention.

FIG. 10 is a schematic view of the liquid chemical supply apparatus 300 according to another embodiment of the present invention.

Referring to FIG. 10, in the liquid chemical supply apparatus 300, feedback control valves 370: 371, 373, and 375 and a flowmeter 380 may be mounted on at least one of the flow rate calibration lines 350: 351 and 355 and the pump vent line 340. When an element for controlling a flow rate is not provided on the pump vent line 340, a pressure may be applied to the flow rate calibration lines 350 while a liquid chemical is being discharged, and thus the discharged (A2 and A3) amounts may be affected. Therefore, the controller 305 may receive, from the flowmeter 380, signals related to flow rates measured in real time, and rapidly operate the feedback control valves 370: 371, 373, and 375 when the flow rates are greater than a preset reference value. The feedback control valves 370: 371, 373, and 375 may operate to open or close passages of the lines on which they are mounted, or to reduce the flow rates. When the feedback control valves 370: 371, 373, and 375 operate, the flow rates measured by the flowmeter 380 may be reduced to be less than or equal to the set reference value. That is, a rapid change in flow rate of the liquid chemical discharged (A4) to the outside through the pump vent line 340 may be prevented.

Meanwhile, the feedback control valves 370: 371, 373, and 375 and the flowmeter 380 may be mounted together with the check valves 360, or optionally mounted.

Therefore, according to the present invention, equal amounts of liquid chemicals PR1 and PR2 may be supplied to the substrate processing apparatuses 200: 210 and 230 disposed at different heights by calibrating a head difference, and a flow rate of a very small amount of a liquid chemical less than or equal to 1 ml may be calibrated.

As described above, according to an embodiment of the present invention, equal amounts of a liquid chemical may be supplied to substrate processing apparatuses disposed at different heights.

In addition, according to an embodiment of the present invention, a flow rate of a very small amount of a liquid chemical may be calibrated.

However, the scope of the present invention is not limited to the above effects.

While the present invention has been particularly shown and described with reference to embodiments thereof, it will be understood by one of ordinary skill in the art that various changes in form and details may be made therein without departing from the scope of the present invention as defined by the following claims.

What is claimed is:

1. A liquid chemical supply apparatus for supplying a liquid chemical to a plurality of substrate processing apparatuses disposed at different heights, the liquid chemical supply apparatus comprising:

a pump for providing a hydraulic pressure for moving the liquid chemical to the plurality of substrate processing apparatuses;

a plurality of liquid chemical supply lines having first ends connected to the pump and second ends respectively connected to the plurality of substrate processing apparatuses, to provide passages through which the liquid chemical moves;

a pump vent line connected to the pump to discharge some of the liquid chemical from the plurality of liquid chemical supply lines to outside; and a plurality of flow rate calibration lines connecting the pump vent line to the plurality of liquid chemical supply lines, respectively.

2. The liquid chemical supply apparatus of claim 1, wherein the second ends of the plurality of liquid chemical supply lines are located at different heights.

3. The liquid chemical supply apparatus of claim 2, wherein the plurality of flow rate calibration lines discharge some of the liquid chemical supplied from the pump through the plurality of liquid chemical supply lines, respectively, to the pump vent line.

4. The liquid chemical supply apparatus of claim 3, wherein an amount of the liquid chemical discharged to the pump vent line through a first flow rate calibration line, among the plurality of flow rate calibration lines, connected to a first liquid chemical supply line, among the plurality of liquid chemical supply lines, having a second end located at a first height is greater than an amount of the liquid chemical discharged to the pump vent line through a second flow rate calibration line, among the plurality of flow rate calibration lines, connected to a second liquid chemical supply line, among the plurality of liquid chemical supply lines, having another end located at a second height, and wherein the first height is higher than the second height.

5. The liquid chemical supply apparatus of claim 1, further comprising:

a check valve for controlling a flow rate of the liquid chemical discharged to the pump vent line, wherein the check valve is mounted on at least one of the plurality of flow rate calibration lines.

6. The liquid chemical supply apparatus of claim 5, wherein the check valve includes a liquid chemical passage with a width less than a width of the liquid chemical passage of at least one of the plurality of flow rate calibration lines.

7. The liquid chemical supply apparatus of claim 6, wherein a plurality of patterns are provided on the liquid chemical passage of the check valve.

8. The liquid chemical supply apparatus of claim 6, wherein the check valve further includes a porous portion disposed on the liquid chemical passage of the check valve.

9. The liquid chemical supply apparatus of claim 6, wherein the liquid chemical passage of the check valve has an orifice shape.

10. The liquid chemical supply apparatus of claim 1, wherein the liquid chemical is a liquid photoresist.

11. The liquid chemical supply apparatus of claim 10, further comprising:

a controller for measuring flow rates of the liquid photoresist moving through the plurality of liquid chemical supply lines.

12. The liquid chemical supply apparatus of claim 11, wherein a difference between amounts of the liquid photoresist supplied to the plurality of substrate processing apparatuses through the plurality of flow rate calibration lines is calibrated to vary within 10%.

13. The liquid chemical supply apparatus of claim 12, wherein the amounts of the liquid photoresist supplied to the plurality of substrate processing apparatuses varies less than or equal to 0.1 milliliter.

14. The liquid chemical supply apparatus of claim 11, wherein amounts of the liquid photoresist supplied from the second ends of the plurality of liquid chemical supply lines to the plurality of substrate processing apparatuses per unit process is less than 1 milliliter (and greater than 0 milliliter).

15. The liquid chemical supply apparatus of claim 11, wherein, on a basis of a flow rate of a first liquid chemical supply line, among the plurality of liquid chemical supply lines, having a second end, some of the liquid chemical is discharged to the pump vent line through at least two flow rate calibration lines, among the plurality of flow rate calibration lines, connected to at least two liquid chemical supply lines, among the plurality of liquid chemical supply lines, having second ends located under the second end of the first liquid chemical supply line, and wherein the second end of the first liquid chemical supply line is located at a highest height among the second ends of the plurality of liquid chemical supply lines.

16. The liquid chemical supply apparatus of claim 11, wherein a feedback control valve and a flowmeter are mounted on at least one of the plurality of flow rate calibration lines and the pump vent line.

17. The liquid chemical supply apparatus of claim 16, wherein the controller controls the feedback control valve to reduce a flow rate measured by the flowmeter, to be less than or equal to a set reference value, when the flow rate measured by the flowmeter is greater than the set reference value.

18. A liquid chemical supply system for supplying a liquid chemical to a plurality of substrate processing apparatuses disposed at different heights, the liquid chemical supply system comprising a liquid chemical supply apparatus and a liquid chemical storage apparatus, wherein the liquid chemical supply apparatus comprises:

a pump for providing a hydraulic pressure for moving the liquid chemical from the liquid chemical storage apparatus to the plurality of substrate processing apparatuses;

a plurality of liquid chemical supply lines having ends connected to the pump and other ends separately connected to the plurality of substrate processing apparatuses, to provide passages through which the liquid chemical moves;

a pump vent line connected to the pump to discharge some of the liquid chemical to outside; and a plurality of flow rate calibration lines connecting the pump vent line to the plurality of liquid chemical supply lines, respectively.

19. The liquid chemical supply system of claim 18, wherein the liquid chemical storage apparatus comprises:

a liquid storage bottle for storing the liquid chemical; and a liquid trap tank interposed between the liquid storage bottle and the pump to hold the liquid chemical before supplying the liquid chemical to the pump, wherein the pump provides a hydraulic pressure for moving the liquid chemical from the liquid trap tank to the plurality of substrate processing apparatuses, and wherein the pump vent line is provided to discharge some of the liquid chemical of the liquid chemical storage apparatus.

20. A liquid chemical supply apparatus for supplying a liquid photoresist to a plurality of substrate processing apparatuses disposed at different heights, the liquid chemical supply apparatus comprising:

a pump for providing a hydraulic pressure for moving the liquid photoresist to the plurality of substrate processing apparatuses;

a plurality of liquid chemical supply lines having ends connected to the pump and other ends separately connected to the plurality of substrate processing apparatuses, to provide passages through which the liquid photoresist moves;

a pump vent line connected to the pump to discharge some of the liquid photoresist to outside, wherein the other ends of the plurality of liquid chemical supply lines are located at different heights;

a plurality of flow rate calibration lines connecting the pump vent line to the plurality of liquid chemical supply lines, respectively; and a check valve for controlling a flow rate of the liquid photoresist discharged to the pump vent line, wherein the check valve is mounted on at least one flow rate calibration line of the plurality of flow rate calibration lines, and includes a liquid chemical passage of the check valve with a width less than a width of the liquid chemical passage of the at least one flow rate calibration line, and wherein a difference between amounts of the liquid photoresist supplied to the plurality of substrate processing apparatuses through the plurality of flow rate calibration lines is calibrated to vary within 10%.

* * * * *